United States Patent
Narayan et al.

(10) Patent No.: US 9,020,783 B2
(45) Date of Patent: Apr. 28, 2015

(54) DIRECT MANIPULATION OF COMPOSITE TERRAIN OBJECTS WITH INTUITIVE USER INTERACTION

(75) Inventors: Smita Narayan, Manchester, NH (US); Christopher E. Putnam, Manchester, NH (US)

(73) Assignee: Autodesk, Inc., San Rafael, CA (US)

( * ) Notice: Subject to any disclaimer, the term of this patent is extended or adjusted under 35 U.S.C. 154(b) by 684 days.

(21) Appl. No.: 13/178,358

(22) Filed: Jul. 7, 2011

(65) Prior Publication Data

US 2013/0013265 A1 Jan. 10, 2013

(51) Int. Cl.

| | |
|---|---|
| G06F 17/50 | (2006.01) |
| G06T 17/05 | (2011.01) |
| G06T 19/20 | (2011.01) |
| G06F 17/30 | (2006.01) |
| G06F 3/0481 | (2013.01) |
| H04L 12/24 | (2006.01) |

(52) U.S. Cl.
CPC ............. *G06F 17/5009* (2013.01); *G06T 19/20* (2013.01); *G06F 17/30241* (2013.01); *G06F 3/04815* (2013.01); *H04L 41/22* (2013.01); *G06T 17/05* (2013.01)

(58) Field of Classification Search
None
See application file for complete search history.

(56) References Cited

U.S. PATENT DOCUMENTS

| | | | | |
|---|---|---|---|---|
| 5,329,464 | A * | 7/1994 | Sumic et al. ...................... 703/1 |
| 5,553,211 | A * | 9/1996 | Uotani ........................... 345/641 |
| 5,980,096 | A * | 11/1999 | Thalhammer-Reyero ............ 1/1 |
| 6,496,814 | B1 * | 12/2002 | Busche ............................ 706/21 |
| 6,732,120 | B1 * | 5/2004 | Du ................................. 715/764 |
| 6,768,928 | B1 * | 7/2004 | Nagasawa et al. ............... 700/98 |
| 6,912,692 | B1 * | 6/2005 | Pappas ........................... 715/762 |
| 7,130,774 | B2 * | 10/2006 | Thomas et al. .................... 703/1 |
| 7,164,883 | B2 * | 1/2007 | Rappaport et al. ........... 455/3.01 |
| 7,523,396 | B2 * | 4/2009 | Lewis et al. .................... 715/700 |
| 7,617,077 | B2 * | 11/2009 | Putnam et al. ..................... 703/1 |
| 7,634,149 | B2 * | 12/2009 | Putnam et al. ................. 382/256 |
| 7,965,902 | B1 * | 6/2011 | Zelinka et al. ................ 382/284 |
| 8,051,087 | B2 * | 11/2011 | Campbell et al. ............. 707/743 |
| 8,171,424 | B1 * | 5/2012 | Karam .......................... 715/810 |
| 8,180,597 | B2 * | 5/2012 | Connor et al. .................... 703/1 |
| 8,346,016 | B1 * | 1/2013 | Zelinka et al. ................ 382/284 |
| 8,457,441 | B2 * | 6/2013 | Joy ............................... 382/284 |
| 8,494,255 | B2 * | 7/2013 | Caduff .......................... 382/154 |
| 8,538,676 | B2 * | 9/2013 | Wuersch et al. ............... 701/400 |
| 2001/0049704 | A1 * | 12/2001 | Hamburg et al. ............. 707/530 |
| 2003/0023412 | A1 | 1/2003 | Rappaport et al. | |

(Continued)

OTHER PUBLICATIONS

D. Giordan, S. Moniz, "Using Adobe Photoshop 5" pp. 1-17, 2007.*

(Continued)

*Primary Examiner* — Kibrom K Gebresilassie
(74) *Attorney, Agent, or Firm* — Gates & Cooper LLP

(57) ABSTRACT

A method, apparatus, system, and computer readable medium provide the ability to manipulate a terrain in a drawing. A composite object of the terrain is obtained in a CAD BIM application. The composite object is a combination of sub-objects that each define a geometry that is part of the terrain. Each of the sub-objects is drawn on a separate corresponding drawable interface instance. A sub-object is selected and in response, the selected sub-object is displayed in its corresponding drawable interface instance. The selected sub-object is directly modified, in canvas, using the drawable interface instance. In response to the modification, the terrain is dynamically updated and displayed.

28 Claims, 10 Drawing Sheets

(56) References Cited

U.S. PATENT DOCUMENTS

| | | | |
|---|---|---|---|
| 2004/0004611 A1* | 1/2004 | Komornicki et al. | 345/418 |
| 2004/0076279 A1* | 4/2004 | Taschereau | 379/218.01 |
| 2004/0194017 A1* | 9/2004 | Cosic | 715/501.1 |
| 2004/0233222 A1 | 11/2004 | Lee et al. | |
| 2005/0034075 A1* | 2/2005 | Riegelman et al. | 715/714 |
| 2005/0068315 A1* | 3/2005 | Lewis et al. | 345/419 |
| 2005/0104884 A1* | 5/2005 | Iwata et al. | 345/440 |
| 2005/0110800 A1 | 5/2005 | Putnam et al. | |
| 2006/0294062 A1* | 12/2006 | Folchetti et al. | 707/3 |
| 2007/0142989 A1* | 6/2007 | Koehrsen et al. | 701/50 |
| 2007/0168923 A1* | 7/2007 | Connor et al. | 717/104 |
| 2008/0183434 A1 | 7/2008 | Putnam et al. | |
| 2008/0262988 A1 | 10/2008 | Williams et al. | |
| 2009/0055136 A1 | 2/2009 | Ilies | |
| 2009/0179899 A1 | 7/2009 | Gregory et al. | |
| 2010/0017731 A1* | 1/2010 | Taira | 715/765 |
| 2010/0289797 A1 | 11/2010 | Tateno et al. | |
| 2013/0007575 A1* | 1/2013 | Bacus et al. | 715/202 |
| 2013/0013264 A1* | 1/2013 | Narayan et al. | 703/1 |
| 2013/0054075 A1* | 2/2013 | Montgomery | 701/25 |
| 2014/0121801 A1* | 5/2014 | Taguchi et al. | 700/98 |

OTHER PUBLICATIONS

Autodesk Design Review, Getting Started Guide, pp. 1-56, 2007.*
Autodesk, AutoCAD Civil 3D 2010 User Documentation, retrieved Mar. 12, 2013, pp. 1-20.
ESRI, Hydrologic Analysis, ArcGIS Desktop Help 9.1, latest update: Mar. 26, 2007, retrieved Mar. 13, 2013, pp. 1-17.
Schor et al., Landforming: An Environmental Approach to Hillside Development, Mine Reclamation and Watershed Restoration, Copyright 2007, John Wiley & Sons, Inc., pp. 179, 184.
Brown et al., Gradients and Vector fields, Department of Mathematics, Statistics and Computer Science, University of Illinois at Chicago, http://www.math.uic.edu/coursepages/math210/labpages/lab5, retrieved Mar. 13, 2013, (1999), pp. 1-17.
Non-final Office Action dated Mar. 22, 2013 for U.S. Appl. No. 13/178,349.
Moore et al., Digital Terrain Modelling: A Review of Hydrological, Geomorphological, and Biological Applications, Hydrological Processes, vol. 5, 3-30 (1991), pp. 1-28.
Autodesk, AutoCAD Civil 3D 2010 Best Practices, Apr. 2009, Autodesk Inc., pp. 129, 132, 133, 137-156.

* cited by examiner

DIRECT MANIPULATION OF COMPOSITE TERRAIN OBJECTS WITH INTUITIVE USER INTERACTION

CROSS-REFERENCE TO RELATED APPLICATIONS

This application is related to the following co-pending and commonly-assigned patent applications, which applications are incorporated by reference herein:

U.S. patent application Ser. No. 13/178, 349, entitled "GRADING METHOD UTILIZING FLOW GRADE SOLUTION", by Smita Narayan and Christopher E. Putnam, et. al., filed on Jul. 7, 2011, Now U.S. Pat. No. 8,676,546; and U.S. patent application Ser. No. 13/178, 353, entitled "INTERACTIVELY SHAPING TERRAIN THROUGH COMPOSABLE OPERATIONS", by Smita Narayan and Christopher E. Putnam, et. al., filed on Jul. 7, 2011.

BACKGROUND OF THE INVENTION

1. Field of the Invention

The present invention relates generally to computer aided design (CAD) applications, and in particular, to a method, apparatus, and article of manufacture for enabling, in a building information model (BIM) CAD application, direct manipulation techniques that allow walking a composable model and modifying the model with intuitive user interaction in two-dimensions (2D) as well as three-dimensions (3D).

2. Description of the Related Art

Grading is configuring the land's surface by removing or adding soil and other earthen material to artificially shape the land to best suit a project. The grading of a site serves three basic purposes: functional, drainage, and aesthetic. These basic purposes often conflict with each other and prior art solutions fail to provide an easy mechanism to satisfy all of these purposes while utilizing a single grading model as the user proceeds from concept to completion of a project. Such problems may be better understood with a description of prior art grading and grading solutions.

Functionality: Terrain grading is used to re-form terrain/land in order to provide land that is functional or can be used for a functional purpose. In this regard, grading reforms the terrain to make it compatible for an intended land use. Such functional land uses may include parking lots, ponds, swales, and other features. To provide for such land use, terrain grading creates finish smooth slopes at specified grades.

Facilitate Drainage: Grading establishes and controls the new drainage pattern to direct the runoff to outfall points and away from buildings.

Aesthetic: A good design creates an aesthetically pleasing and appealing landscape. Natural landforms are created by using concave and convex shaped slopes rather than uniform gradient slopes. The creation of aesthetic landforms must be balanced by the cost of constructing them.

These goals often conflict with each other and to integrate them into the final design, they must be analyzed collectively. In practice, a grading plan is established through several successive trials of different schemes. This process can be very tedious. A grading scheme often involves projecting slopes from curves representing shoulder edges or water boundaries, and leveling them against the existing terrain. The implementation of this concept is fraught with difficulties due to a variety of complex scenarios that could not be handled by a naïve ray projection algorithm, especially when projecting from curves with rapid elevation changes.

More specifically, prior art products provide a grading scheme by projecting each segment of a curve at a given cross-slope to produce bounded panels, and then combining them. Such a methodology involves complex models whose history of operations is difficult to track. The complexity of the existing solution results in difficult (if not impossible) software implementations that are error prone, unstable, and may completely fail (if supplied geometry is complicated). Accordingly, users are hesitant to use the prior art product on account of such stability problems. The prior art also provides few tools to modify existing solutions in an intuitive manner. Further, the prior art fails to provide tools that can be used in a conceptual design that can also later be refined for generating production drawings. In this regard, it is desirable to provide a tool that can be used to obtain quick answers for early decision making (e.g., approximate values of earthwork quantities) that can be refined later to produce a more accurate solution.

As described above, a particular need is that of designing the terrain to facilitate drainage. The prior art provides a complex methodology that is neither natural nor user friendly. In this regard, the prior art measures the cross grade (or cross slope) perpendicular to the curve from which a slope is projected. Each segment of the curve is projected at a given cross-slope to produce bounded panels that are combined by intersecting them against each other. This approach involves complex algorithms to solve inside corners and the intersection of overlapping solutions. For example, the rapid transitions of offsets across the inside corners cause incomplete or failed 3D intersections of the adjacent, bounded planes. Likewise, a multi-elevation rounded corner projected beyond its radius produces equally complex intersection geometry. The intersections are solved by simplifying the geometry and integrating the solution into planar topology to remove redundant loops. However, stability problems and specialized functionality restrict the use of the prior art methods.

Thus, prior art solutions produce inside corners with complex geometry that is hard to clean, especially if the solutions involve degenerate partial solutions. Solving such inside corners involves complex algorithms and is a cumbersome process. In addition, when designing the drainage, the prior art fails to provide the ability to create or use organic shapes that could be used to produce an aesthetically pleasing landscape.

Moreover, there are few tools for modifying prior art solutions in ways that directly map to site development needs. Even though there is a large set of elevation/grade editing tools, the overlapping line work can create difficult to resolve stability problems and elevation conflicts. Predicting the impact of an edit to a solution requires experience, and factors like tessellation quality, crossing break lines, and Delaunay triangulation rules can confound a new user.

Accordingly, while prior art solutions may provide a model for visualizing and grading a terrain, such prior art models have various limitations. For example, in prior art solutions, the history of the model cannot be viewed interactively, users cannot track the order of operations, and consequently, users may not be provided with the ability to understand how a model was built. Such a lack of understanding gives rise to a communication gap across engineers working on the same project. In addition, existing prior art models do not allow the user to click the model elements and modify them interactively in 3D. Also, prior art models fail to provide a mechanism for modifying offsets and slopes interactively.

As described above, the existing solution does not allow the creation of a conceptual model that can later be refined into a more accurate model. In practice, before any detailed grading plans are underway, the designer needs to develop a generalized grading scheme to determine any problem areas and get a feel for the type of limitations the site may have as the design progresses. In the preliminary analysis, engineers are often looking for quick early-stage approximate answers (like road and parking area gradients, drainage patterns, rough estimates of cut and fill quantities, need for steep slopes, retaining walls, etc.) to make quick decisions that can later be refined into more accurate solutions for production drawings. The prior art fails to provide such capabilities.

In view of the above, it is desirable to enable a single set of tools that can be used from concept through completion, in the same environment, while allowing the user to design a grading solution in a natural, interactive, direct, and desirable manner.

SUMMARY OF THE INVENTION

Embodiments of the present invention overcome the problems of the prior art by providing a composable model with direct manipulation capabilities that allow a user to walk the model and modify the model with intuitive user interaction in 2D as well as 3D.

Embodiments of the invention provide direct manipulation capabilities to expose the structure of a highly composable model through selectable sub-entities. It empowers the users to understand the model structure and manipulate the structure to achieve the desired result. Each element of a composite object is displayed using a different instance of a drawable interface. Drawables are switched as different elements are selected (e.g., with the help of object reactors—a reactor is a function that launches automatically based on the occurrence of a trigger/event such as the selection of an element, a change in a drawing, execution of other commands, on a drawing about to be closed, etc.).

The elements are drawn differently depending upon whether they are selected or not. When an element is selected, the whole element is drawn in its full extents and when the final object is displayed, only that part of each element is drawn that contributes to the final object. Both atomic and composite elements can be drawn in this manner. As used herein, an element that is completely independent of other elements in the model is called an atomic element. Planes, surface grids, and depth buffers (e.g., as described in the co-pending application incorporated by reference above) are examples of atomic grids. An element that is created by combining two or more elements is a composite element. For example, the output of an operation that combines two or more elements using a Boolean operation is a composite element.

The model elements may be iterated in proper sequence and selected elements can be switched following user clicks, thereby allowing the users to walk through the various stages of the model and track the history of operations. Such capabilities help users understand the whole model by understanding the parts and how they are combined. The users can query properties (e.g., volumes) of the model at various intermediate stages (e.g., by selecting an intermediate stage of ground modification and viewing the properties of the selected stage). Further, users can operate directly in-canvas with the model and edit the parameters of any piece/element/sub-object and optimize a terrain design.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Embodiments of the invention provide direct manipulation capabilities to build, understand and modify a BIM CAD model.

Hardware Environment

Figure 1:
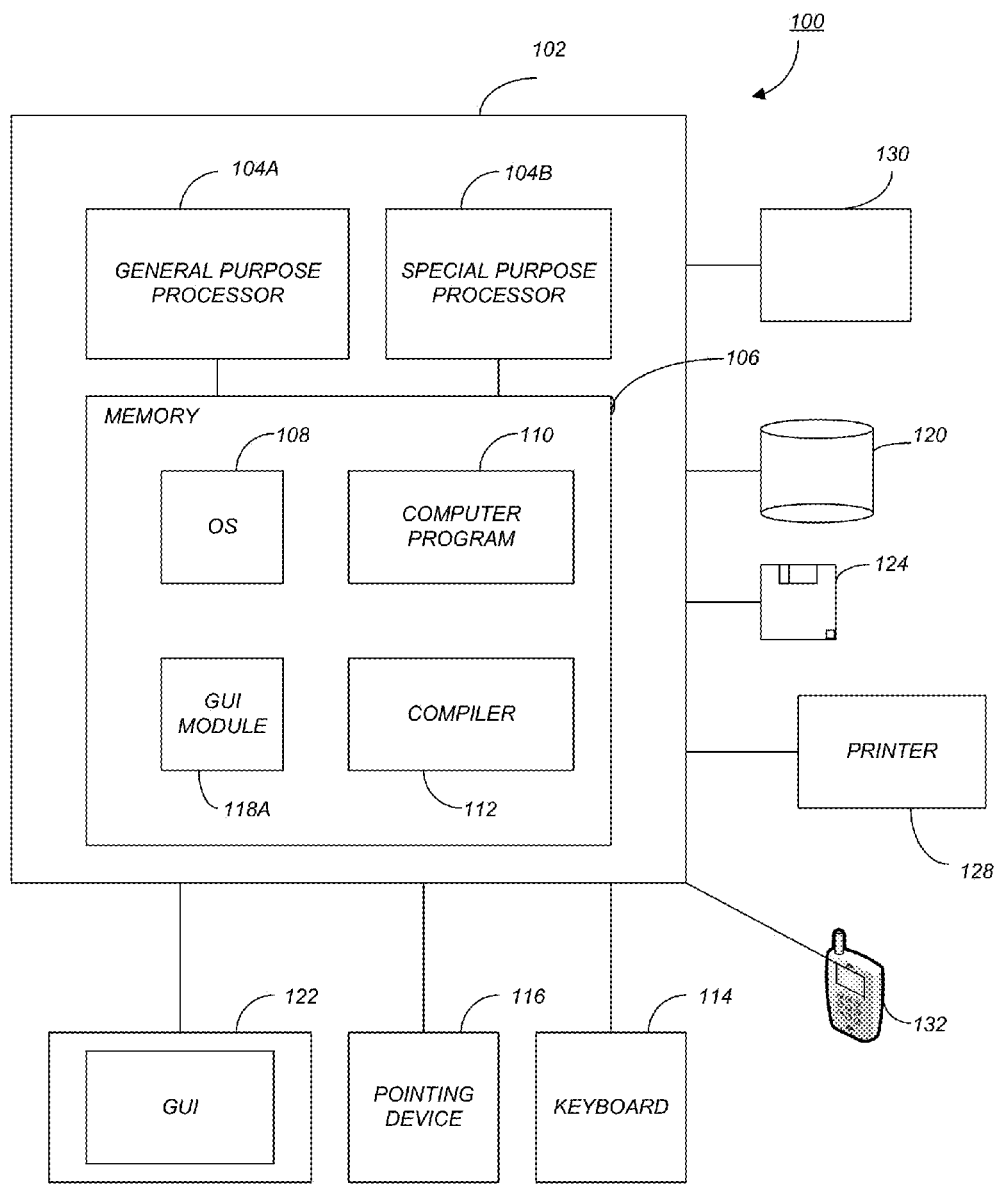
FIG. 1 is an exemplary hardware and software environment used to implement one or more embodiments of the invention.

FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM). The computer 102 may be coupled to other devices, including input/output (I/O) devices such as a keyboard 114, a cursor control device 116 (e.g., a mouse, a pointing device, pen and tablet, etc.) and a printer 128. In one or more embodiments, computer 102 may be coupled to, or may comprise, a thin client device. Such a thin client device may comprise a device with limited and/or full processing capabilities and is often portable/handheld and may include a media viewing/listening device 132 (e.g., an MP3 player, IPod™, Nook™, portable digital video player, cellular device, personal digital assistant, handheld computer, etc.).

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108 to provide output and results.

Output/results may be presented on the display 122 or provided to another device for presentation or further processing or action. In one embodiment, the display 122 comprises a liquid crystal display (LCD) having a plurality of separately addressable liquid crystals. Each liquid crystal of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118A. Although the GUI module 118A is depicted as a separate module, the instructions performing the GUI functions can be resident or distributed in the operating system 108, the computer program 110, or implemented with special purpose memory and processors.

Some or all of the operations performed by the computer 102 according to the computer program 110 instructions may be implemented in a special purpose processor 104B. In this embodiment, the some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program instructions. In one embodiment, the special purpose processor is an application specific integrated circuit (ASIC).

The computer 102 may also implement a compiler 112 which allows an application program 110 written in a programming language such as COBOL, Pascal, C++, FORTRAN, or other language to be translated into processor 104 readable code. After completion, the application or computer program 110 accesses and manipulates data accepted from I/O devices and stored in the memory 106 of the computer 102 using the relationships and logic that was generated using the compiler 112.

The computer 102 also optionally comprises an external communication device such as a modem, satellite link, Ethernet card, or other device for accepting input from and providing output to other computers 102.

In one embodiment, instructions implementing the operating system 108, the computer program 110, and the compiler 112 are tangibly embodied in a computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program instructions which, when accessed, read and executed by the computer 102, causes the computer 102 to perform the steps necessary to implement and/or use the present invention or to load the program of instructions into a memory, thus creating a special purpose data structure causing the computer to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device" and "computer program product" as used herein are intended to encompass a computer program accessible from any computer readable device or media.

Of course, those skilled in the art will recognize that any combination of the above components, or any number of different components, peripherals, and other devices, may be used with the computer 102.

Figure 2:
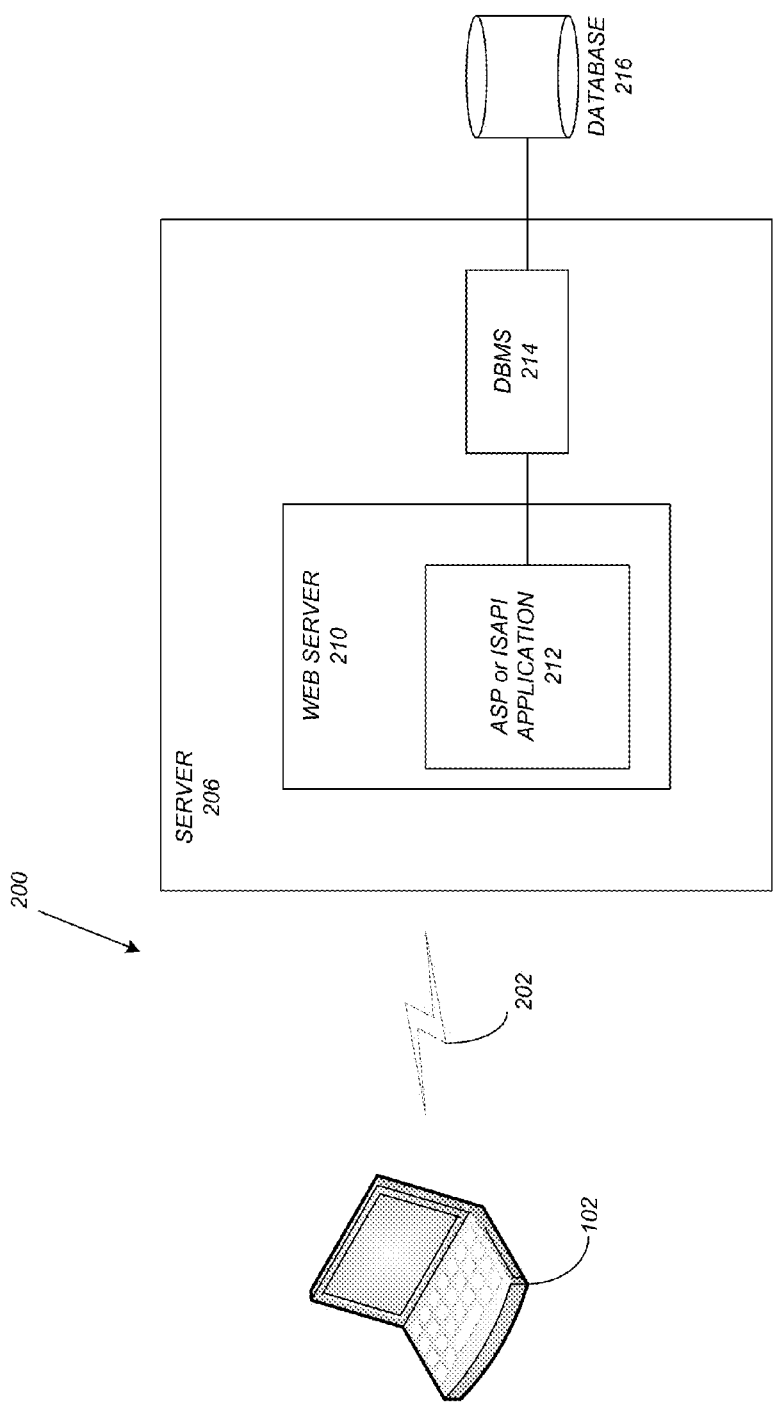
FIG. 2 schematically illustrates a typical distributed computer system using a network to connect client computers to server computers in accordance with one or more embodiments of the invention.

FIG. 2 schematically illustrates a typical distributed computer system 200 using a network 202 to connect client computers 102 to server computers 206. A typical combination of resources may include a network 202 comprising the Internet, LANs (local area networks), WANs (wide area networks), SNA (systems network architecture) networks, or the like, clients 102 that are personal computers or workstations, and servers 206 that are personal computers, workstations, minicomputers, or mainframes (as set forth in FIG. 1).

A network 202 such as the Internet connects clients 102 to server computers 206. Network 202 may utilize ethernet, coaxial cable, wireless communications, radio frequency (RF), etc. to connect and provide the communication between clients 102 and servers 206. Clients 102 may execute a client application or web browser and communicate with server computers 206 executing web servers 210. Such a web browser is typically a program such as MICROSOFT INTERNET EXPLORER™, MOZILLA FIREFOX™, OPERA™, APPLE SAFARI™, etc. Further, the software executing on clients 102 may be downloaded from server computer 206 to client computers 102 and installed as a plug in or ACTIVEX™ control of a web browser. Accordingly, clients 102 may utilize ACTIVEX™ components/component object model (COM) or distributed COM (DCOM) components to provide a user interface on a display of client 102. The web server 210 is typically a program such as MICROSOFT'S INTERNENT INFORMATION SERVER™.

Web server 210 may host an Active Server Page (ASP) or Internet Server Application Programming Interface (ISAPI) application 212, which may be executing scripts. The scripts invoke objects that execute business logic (referred to as business objects). The business objects then manipulate data in database 216 through a database management system (DBMS) 214. Alternatively, database 216 may be part of or connected directly to client 102 instead of communicating/obtaining the information from database 216 across network 202. When a developer encapsulates the business functionality into objects, the system may be referred to as a component object model (COM) system. Accordingly, the scripts executing on web server 210 (and/or application 212) invoke COM objects that implement the business logic. Further, server 206 may utilize MICROSOFT'S™ Transaction Server (MTS) to access required data stored in database 216 via an interface such as ADO (Active Data Objects), OLE DB (Object Linking and Embedding DataBase), or ODBC (Open DataBase Connectivity).

Generally, these components 208-218 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the term "user computer", "client computer", and/or "server computer" is referred to herein, it is understood that such computers 102 and 206 may include portable devices such as cell phones, notebook computers, pocket computers, or any other device with suitable processing, communication, and input/output capability.

Of course, those skilled in the art will recognize that any combination of the above components, or any number of different components, peripherals, and other devices, may be used with computers 102 and 206.

Software Embodiments

Embodiments of the invention are implemented as a software application on a client 102 or server computer 206. As described above, such a software application provides direct manipulation capabilities to build, understand and modify composite objects in a terrain model with intuitive user interaction. Control-click actions of a user via a cursor control device (e.g., a computer mouse, stylus, etc.) provide the ability to select subentities for further grip editing of input parameters. In addition, contours and face colors may indicate which primitive subentity contributed to the elevation of a terrain at a given point (e.g., a grid point). The user can operate directly in-canvas with the model and edit parameters of any piece. Further, the user can walk through the successive stages of the model.

To make the terrain shaping work interactive, embodiments of the invention provide direct manipulation capabilities that reveal the model structure and provide a seamless mechanism to modify the model interactively. This is achieved by drawing each piece of the composite object on a separate instance of a drawable interface, that is shown or hidden from view based on user clicks. A user can build a model using simple cut and fill commands, walk through the model, understand the history of operations, select any operation, and modify it in-canvas. The model updates dynamically following user edits.

Accordingly, in the prior art, the history of the model cannot be viewed interactively. However, in embodiments of the present invention, to follow the history of operations, the user can click individual pieces and walk through the successive stages of the model. In this manner, direct manipulation capabilities help the user understand how the model was built. Further, the direct manipulation serves to reduce the communication gap across engineers working on the same project, which is an issue with prior art solutions.

Following these steps, embodiments of the invention provide an interactive (real-time) ability to manipulate models within the active terrain, saving time and specific steps that were previously needed by the user. Thus, while the prior art does not allow the user to click the model elements and modify them interactively in 3D, embodiments of the present invention provide such capabilities by allowing the user to pick any piece and modify it in-canvas. Further, in the prior art models, there is no mechanism for modifying various design parameters like offset values, slope values, slope directions, etc. interactively. In embodiments of the present invention, offsets, slopes and slope directions may be modified intuitively through dimension grips.

Embodiments of the invention allow a user to view the terrain using two different viewports, a 2D view of the terrain and a 3D view of the terrain. As operations are added, the entity representing the terrain gets modified, thus presenting the user with the finished ground automatically (i.e., dynamically in real-time without additional user input). Modifying the entity in either the 2D or 3D viewport updates the other view on the fly.

The direct manipulation techniques may serve one or more of the following purposes:

1. Design optimization through collective analysis of conflicting project goals: Since the model updates collectively, various design parameters can be edited and the resulting net volumes, pond storage volumes, aesthetics, etc. can all be analyzed collectively. The user can easily raise or lower cut and fill areas to achieve some semblance of earthwork balance for cost-effective design, while maintaining the design constraints and other functional requirements. Direct manipulation tools thus allow users to build a cost-effective, sustainable design that balances all project requirements.

2. Speed changes during design: Any design parameter can be modified (e.g., by modifying a design parameter of a sub-object) and the design updates collectively and dynamically.

3. Facilitate communication among engineers: Tracking the history of operations is easy and this serves to bridge the communications gap across engineers who work on the same project in different phases.

ADVANTAGES

Embodiments of the present invention provide many advantages (over the prior art solutions) including direct manipulation capabilities that speed time to completion with simple and efficient geometric revision and editing resources. Further, operations may be presented to the user as selectable sub-entities of a grading object (i.e., primitive operations are exposed as selectable sub-entities). The maximum extents of each sub-object are determined by the site boundary that determines the working area. The extents of the working area can be modified by modifying the site boundary. The shape of each sub-object is driven by drawing objects (like curves or surfaces), other sub-objects and/or design parameters, which can be edited by the user.

Additionally, the present invention allows the presentation of cut/fill volumes through the intermediate stages. Also, operating directly in-canvas with the model is very intuitive (compared to that of not being able to directly modify objects in-canvas). A further advantage includes the ability to perform design optimization through intuitive user interaction and dynamic feedback.

Logical Flow

Figure 3:
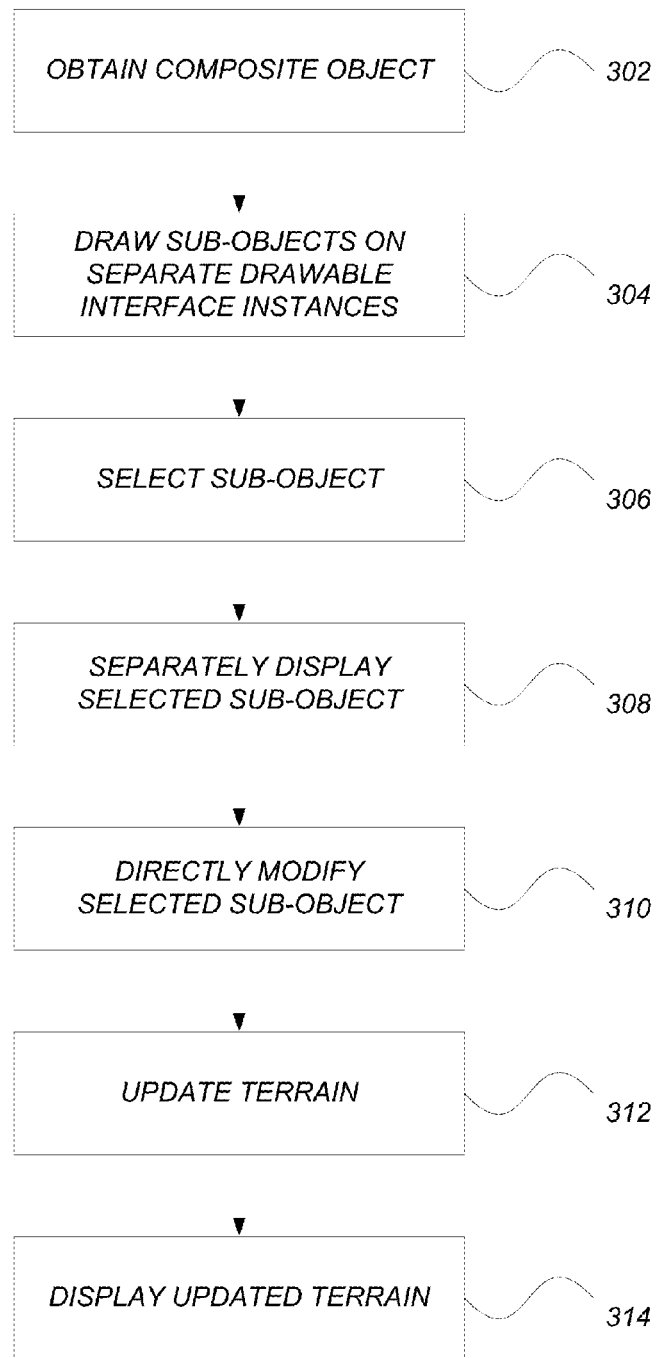
FIG. 3 is a flow chart for manipulating a terrain in accordance with one or more embodiments of the invention.

FIG. 3 is a flow chart for manipulating a terrain in accordance with one or more embodiments of the invention.

At step 302, a composite object of a terrain is obtained in a computer-aided design (CAD) building information model (BIM) application. The composite object is a combination of two or more sub-objects. Each of the sub-objects defines a geometry that is part of the terrain. Further, each of the two or more sub-objects is a result of an operation and the two or more sub-objects are arranged in a system of dependent relationships.

At step 304, each of the sub-objects is drawn on a separate drawable interface instance. Thus, each sub-object has or corresponds to a different drawable interface instance. In unselected mode, only that part of each sub-object is drawn which contributes to the final ground. All sub-objects are drawn with unique colors and selection markers, allowing various elements to be easily identified and selected. The sub-objects are drawn as colored contours in 2D view and colored faces in 3D solid-shaded view.

A step 306, one of the two or more sub-objects is selected. Such a selection may be performed by receiving user clicking input via a cursor control device while a cursor is over/hovering over a sub-object in-canvas. Further, the view and sub-object being directly modified can be switched by selecting a different one (or set) of the sub-objects.

At step 308, in response to the selecting, the selected sub-object is separately displayed in its corresponding drawable interface instance. Such a display may cause the selected sub-object to be displayed as a whole to its full extents. Further, in response to the selecting, one or more transient dynamic dimension objects representing one or more corresponding input parameters of the selected sub-object may be displayed. If the sub-object is reselected again after step 308, the next composite sub-object created from the reselected sub-object may be displayed in the drawable interface instance (corresponding to the composite sub-object) (e.g., as a whole to the sub-object's full extents). Such a reselection may also display updated/finished terrain if no composite object was created from the selected sub-object. In addition, the user may opt to select one of the sub-objects corresponding to the existing ground and then repeatedly click. In response to such actions, sequential stages with which the existing ground was modified incrementally may be shown, where each incremental sequential stage represents an each operation applied to the existing ground to reform the existing ground into the updated terrain/finished ground. The sequential stages may then be traversed and cut and fill volumes may be queried at any intermediate state.

At step 310, one of the selected sub-objects is directly modified, in-canvas, using its corresponding drawable interface instance. In various embodiments, the same drawable interface instance draws differently in 2D view and 3D view. The direct modification of the sub-object in one view/interface instance dynamically updates the other view/interface instance. The direct modification may be performed by grip-editing one of the transient dimension objects representing the corresponding input parameters of the selected sub-object, sending the selected object to the front or back, or replacing the selected sub-object with a new composite sub-object created from the selected sub-object. If replaced, a surface layout may be built by combining planes with specific flow grades and directions, thus allowing control on directing drainage to outfall points.

At step 312, in response to the direct modification, the terrain is dynamically updated (e.g., updated in real-time and automatically, without additional user input). Such an updating may update both a 2D view and 3D view of the drawable instance containing updated terrain/finished ground.

At step 314, the updated terrain is displayed (e.g., on a display device). Such an updated display may display only a part of the two or more sub-objects that contribute to the composite object representing the finished ground/updated terrain. In other words, the whole sub-objects may not be displayed to their full extents—only those portions needed for the final display are displayed.

Exemplary Terrain Shaping Models

The sub-objects of the model can be viewed sequentially by clicking in canvas to understand the steps with which the model was created.

Figure 4A:
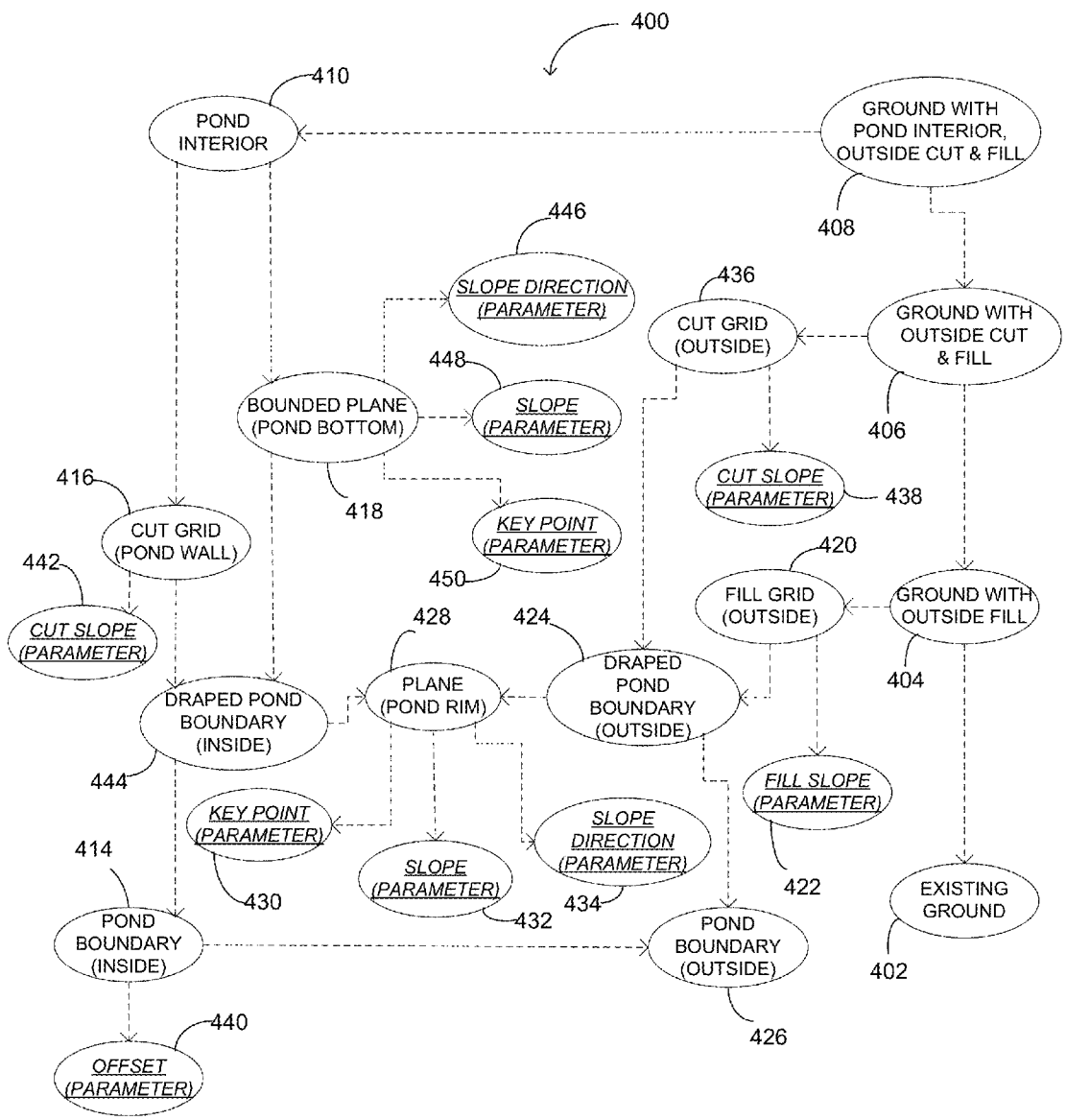
FIG. 4A shows an exemplary model of a pond with sub-objects representing the intermediate stages, which can be traversed in accordance with one or more embodiments of the invention.

FIG. 4A shows an exemplary model 400 of a pond with sub-objects representing the intermediate stages, which can be traversed in accordance with one or more embodiments of the invention. When the user clicks (e.g., using ctrl-click) at any point on the existing ground 402 (which may be identified by its color), the sub-object for the existing ground 402 is drawn in its full extents using the corresponding drawable interface instance. This view shows the existing ground model 400 before any operations are added. When the user clicks on the model 400 again, the next composite element created from the existing ground 402 is shown in its full extents, which in this case is the ground with the outside fill 404. When the user clicks again, the ground with both outside fill and outside cut 406 is shown, followed by the finished pond with outside cut and fill areas 408, as well as pond rim and interior 410. In this way, by presenting the operations as selectable sub-entities, the user can walk through the successive stages of the composite model 400 and understand how the model 400 was built.

Every sub-object on the ground 402 has an identifier that indicates its type, to allow users to easily select the desired feature on a finished ground. Further, various parameters and subjects may exist for each node/subnode. For example, sub node 404 has a dependent sub-node that specifies the outside fill grid 420. Node 420 has the fill slope parameter 422 and the draped pond outside boundary 424. The draped pond outside boundary 424 has dependent subnodes that specify the outside pond boundary 426 and the pond rim plane 428. The pond rim plane 428 has parameters 430-434 for the key point, the slope, and the slope direction. Similarly, the ground with outside cut and fill 406 has a dependent sub node representing the outside cut grid 436 which in turn has a corresponding sub node for the cut slope parameter 438. The outside draped bond boundary 424 is a subnode of both the outside fill grid 420 and the outside cut grid 436. All dependencies are indicated with arrows in the diagram.

Figure 4B:
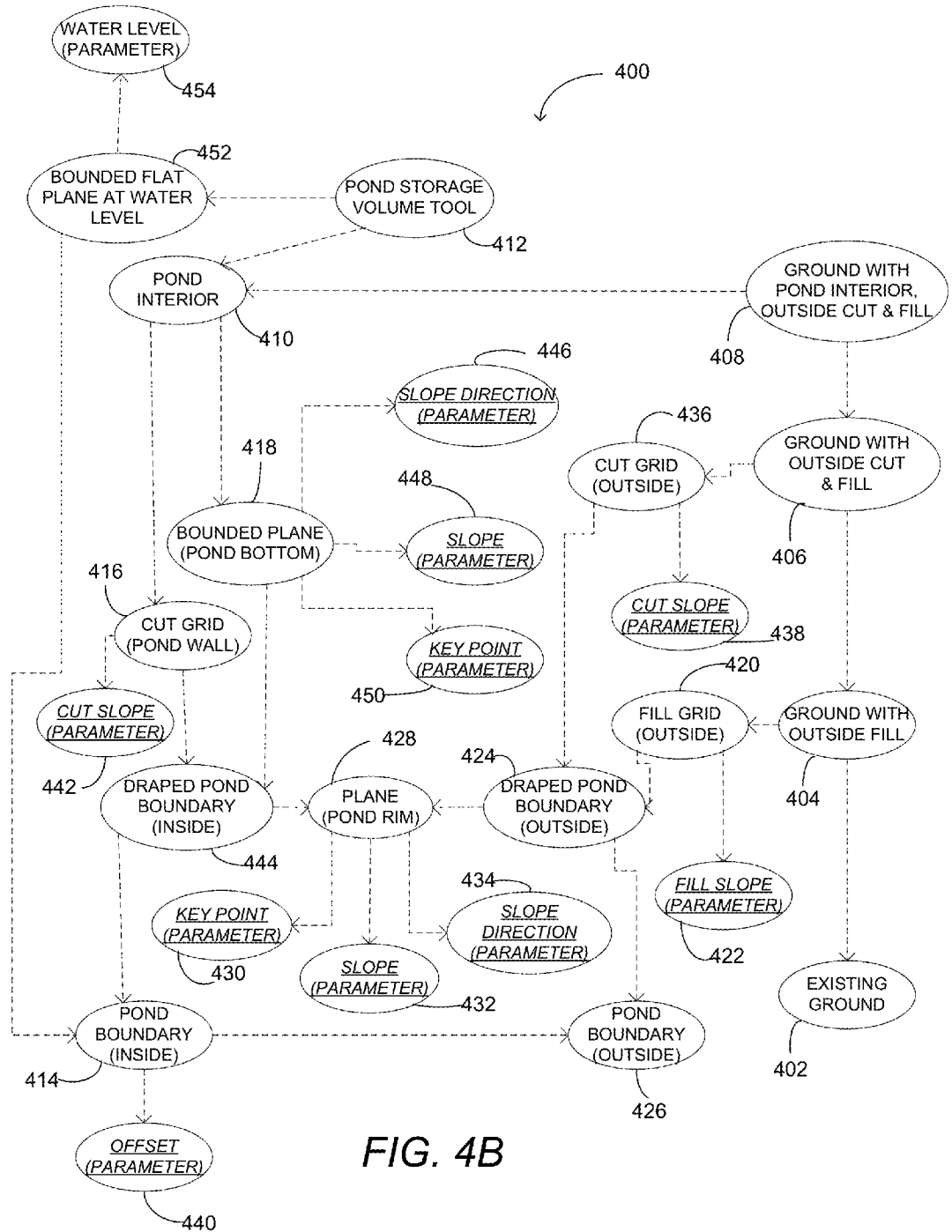
FIG. 4B shows water surface added to the pond shown in FIG. 4A, as well as a pond storage volume tool for estimating the storage volume, by selecting the sub-object representing the pond interior, in accordance with one or more embodiments of the invention.

FIG. 4B shows water surface added to the pond shown in FIG. 4A, as well as a pond storage volume tool 412 for estimating the storage volume at the given water-level. The water surface was added by selecting the sub-object representing the pond interior 410, in accordance with one or more embodiments of the invention. When the user clicks anywhere inside the pond and indicates that he wants to add water surface to a pond, the node representing the pond interior 410 at that location and pond boundary 414 are automatically selected from which the water surface 452 (i.e., the bounded flat plane at the water level) and the storage volume tool 412 can be created. The water surface 452 (having a water level parameter 454) is known as working geometry, since it is not combined with the finished ground. It can be shown or hidden from the view based on user intent. The primary purpose of creating the water surface geometry 452 is to allow the computation of a pond storage volume as the volume between the element representing the pond interior 410 and the water surface 452. Displaying the water surface also allows the user to grab it in 3D view, and change its elevation. The pond storage volume updates dynamically, following edits to water level 454 as well as pond dimensions (e.g., the pond boundary 414). The cut and fill volumes, displayed on the total volume tool (not shown in the figure) are also updated simultaneously. This allows the user to design the pond for a given storage volume (indicated on pond storage volume tool) as well as minimize the earthwork (indicated on total volume tool) simultaneously.

Sub entity selection (e.g., using ctrl-click where the ctrl key is depressed while clicking a cursor control device) may be used for grip editing action parameters. When the user grip-edits the sub-object representing the inner rim boundary, a temporary, dynamic dimension object showing the offset value is invoked and displayed. The user can then edit the dimension by moving its grip or typing an offset value. This triggers the reactor events, which update the model 400 elements in a fixed sequence. First, the dependent offset parameter is evaluated and updated. Then, the inner boundary of the pond 414 is evaluated and updated (e.g., using the offset parameter 440). Then, the draped pond inside boundary 444, the pond wall 416 (cut grid), the pond bottom 418, the pond interior 410, and the finished ground are evaluated in that order. The pond wall/cut grid 416 has a cut slope parameter 442 and a subnode representing the inside draped pond boundary 444. The bounded plane for the pond bottom interior 418 has parameter nodes 446-450. The working geometry representing water surface updates its extents after the inner pond boundary 414 has been evaluated. The pond storage volume is updated when all its dependent elements (water surface and pond interior 410) have finished evaluating. All other model elements remain unchanged, as they are not impacted by this action.

Figure 5A:
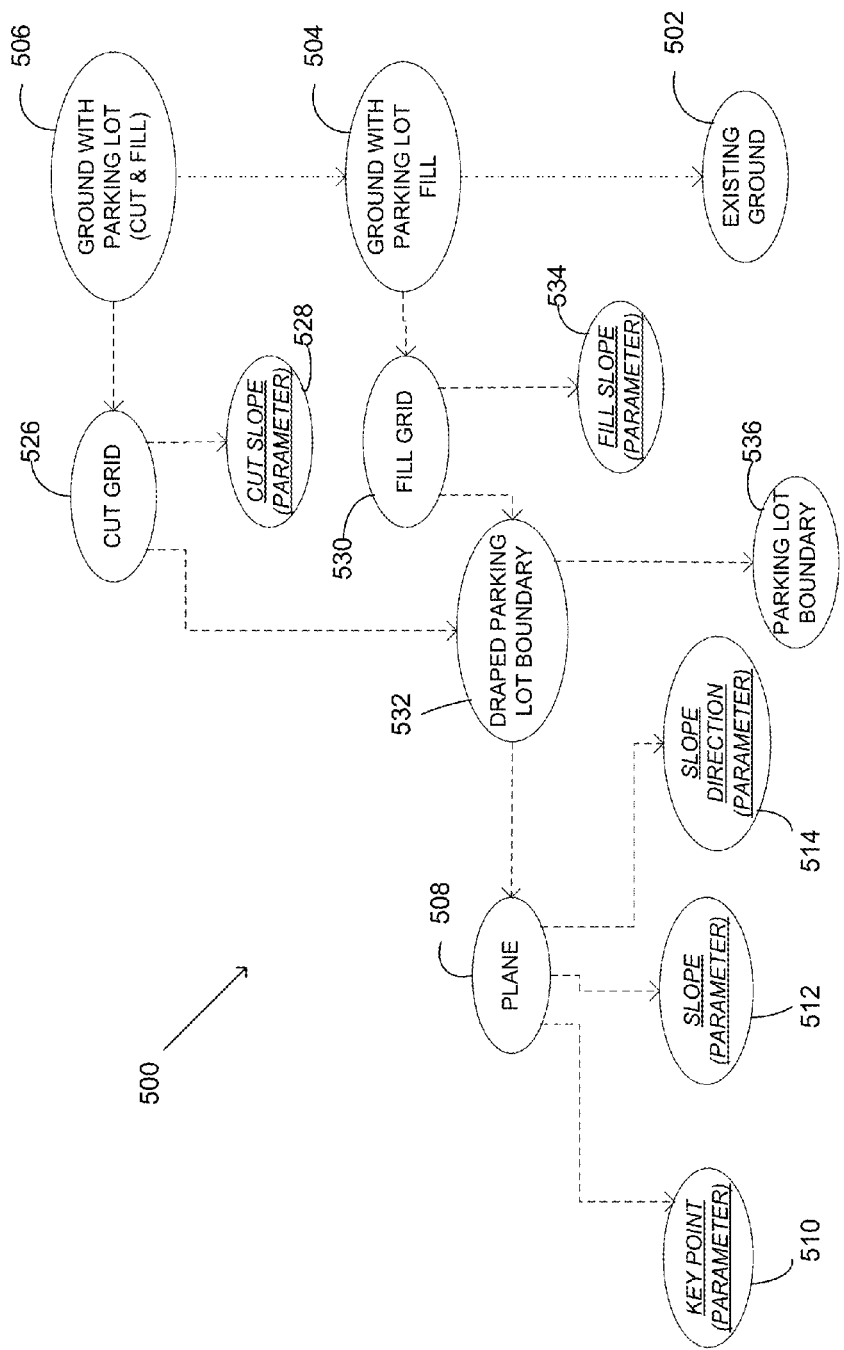
FIG. 5A shows an exemplary model of a parking lot with sub-objects representing the intermediate stages, which can be traversed in accordance with one or more embodiments of the invention.

FIG. 5A shows an exemplary model of a parking lot with sub-objects representing the intermediate stages, which can be traversed in accordance with one or more embodiments of the invention. When the user clicks at any location on the existing ground 502 (e.g., using ctrl click), the existing ground 502 (before any operations were added) is drawn in its full extents. When the user clicks again, the ground with the parking lot fill 504 is shown. Next, the finished ground with parking lot (cut as well as fill) 506 is shown.

The interior plane 508 of the parking lot can be defined using three input parameters: the key point 510 (absolute point through which the plane passes), plane gradient (e.g., slope) 512 and direction (e.g., slope direction) of the gradient 514. If the user clicks (using ctrl click) on the interior plane 508 of the parking lot, the plane is drawn in its full extents. All input parameters 510-514 are displayed using transient dynamic dimension objects in 2D and 3D view. The user can grip-edit the dimensions to modify the input parameters 510-514 and the model 500 updates collectively and dynamically, following user edits. Similar to FIGS. 4A and 4B, each node/subnode may also have subnodes/parameters. For example, the ground with parking lot cut and fill 506 may be defined using the cut grid 526 having a cut slope input parameter 528. Similarly, the ground with parking lot fill 504 may be defined using fill grid 530. Both the cut grid 526 and fill grid 530 may be defined using the draped parking lot boundary 532. The fill grid 530 may also have an input parameter 534. The draped parking lot boundary 532 may also have a general parking lot boundary node 536 from which it may be derived.

Figure 5B:
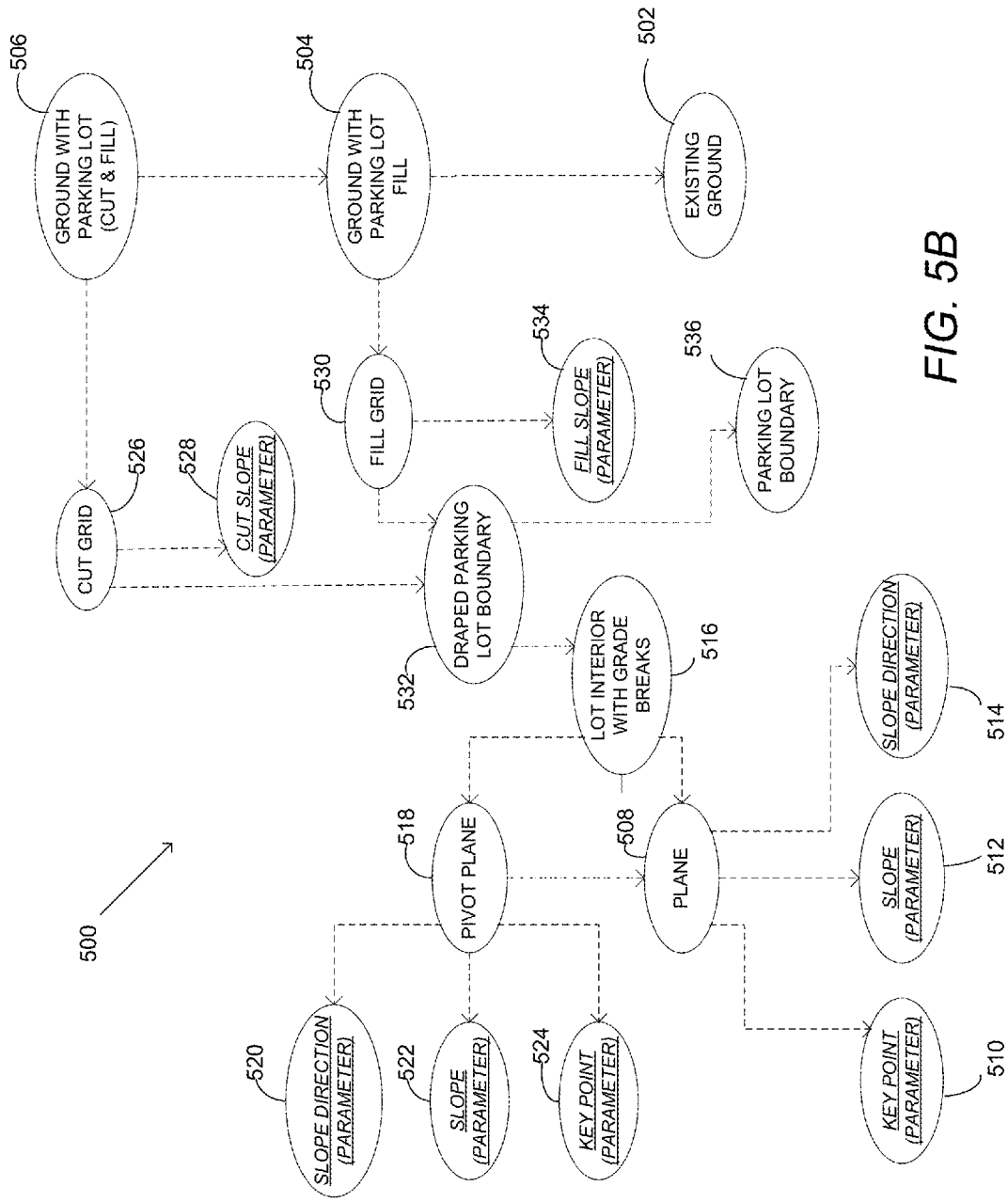
FIG. 5B shows the model of a parking lot with grade break, which has been added to the surface of the parking lot in FIG. 5A by modifying the interior plane, in accordance with one or more embodiments of the invention.

Optionally, the user can sub-select the plane 508 and add a grade break. FIG. 5B shows the model 500 of a parking lot with grade break 516, which has been added to the surface of the parking lot in FIG. 5A by modifying the interior plane 508, in accordance with one or more embodiments of the invention. This operation creates a new node 516 representing grade break geometry, which is the result of combining the selected plane 508 with a new pivot plane 518 with user-specified parameters 520-524. The pivot point represents the point of intersection of the two planes 508 and 518, which can be modified by grip-editing the pivot point. This process can be repeated iteratively to create a surface layout by combining planes with specific flow grades and directions, thus allowing the user more control on directing drainage to outfall points.

Figure 6A:
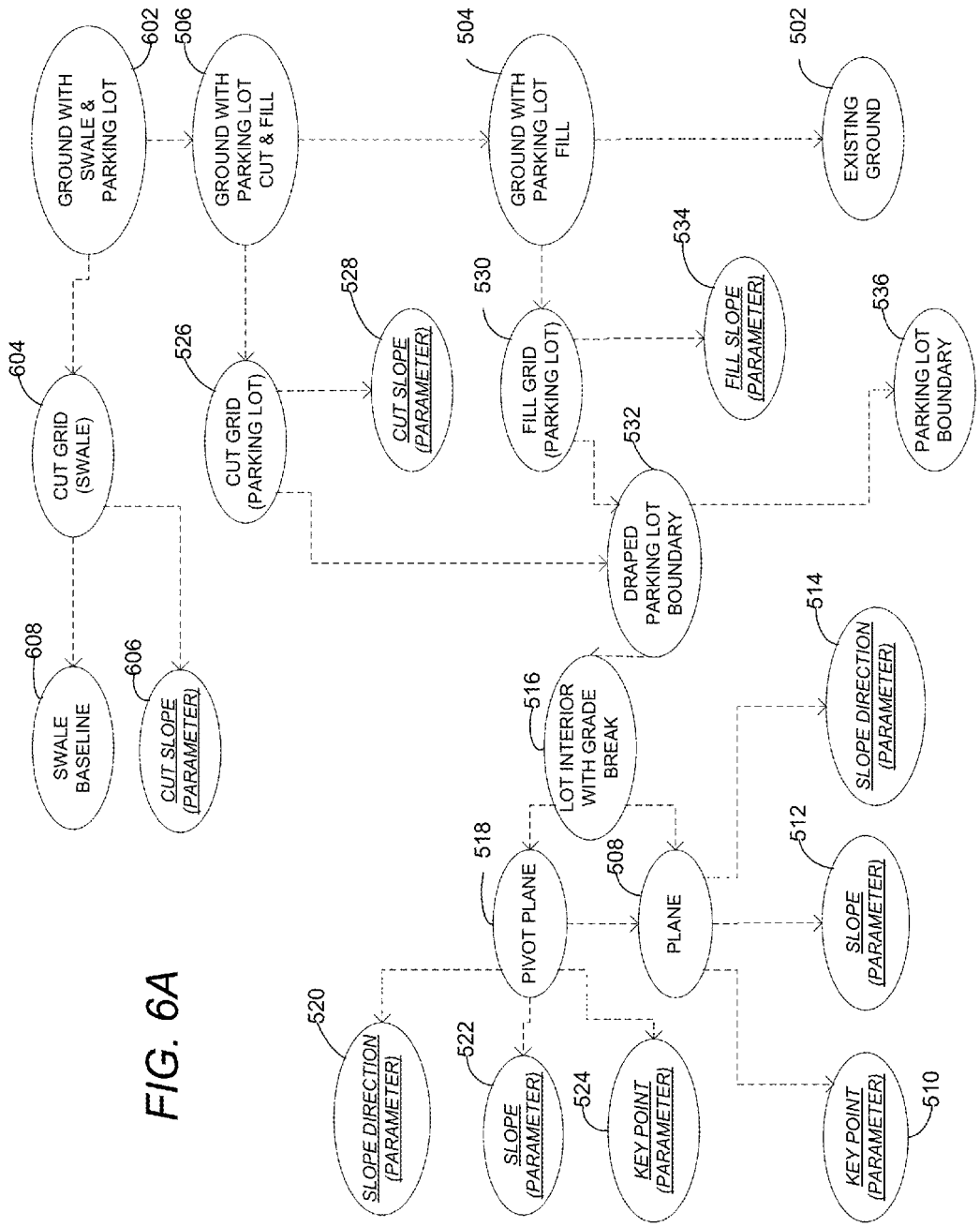
FIGS. 6A and 6B illustrate the models of a finished ground with swale (added to the surface of the parking lot in FIGS. 5A and 5B), before and after reordering the sub-objects respectively, accomplished by pushing model elements to front or back, in accordance with one or more embodiments of the invention.

FIG. 6A illustrates the model of a finished ground with swale, added to the surface of the parking lot in FIG. 5B. Clicking (using ctrl+click) at a location on the existing ground 502 repeatedly will show the sequential stages with which the ground was modified, namely, existing ground 502, ground with parking lot fill 504, ground with parking lot (cut and fill) 506, and the finished ground with parking lot and swale 602, in that order.

The user may click on the parking lot cut area 526. This will display a dynamic dimension object for the cut slope parameter 528 in the desired format. The user may edit the value of slope, and this will update three nodes: the geometry of parking cut area 526, the ground with parking lot 506 and the finished ground with parking lot and swale 602. All other nodes would remain undisturbed.

If swale overlaps the parking lot, it will cut into the parking lot surface. In that case, the user may desire to push the swale behind the parking lot. The user can accomplish this by clicking at a location on swale, and indicating (from context menu) that he desires to push it behind the previous operation. In this way, the elements can be pushed to front or back, according to user intent, until the desired result is obtained. In the model, the swale cut grid is represented by node 604 having an input parameter 606 and a swale baseline 608.

Figure 6B:
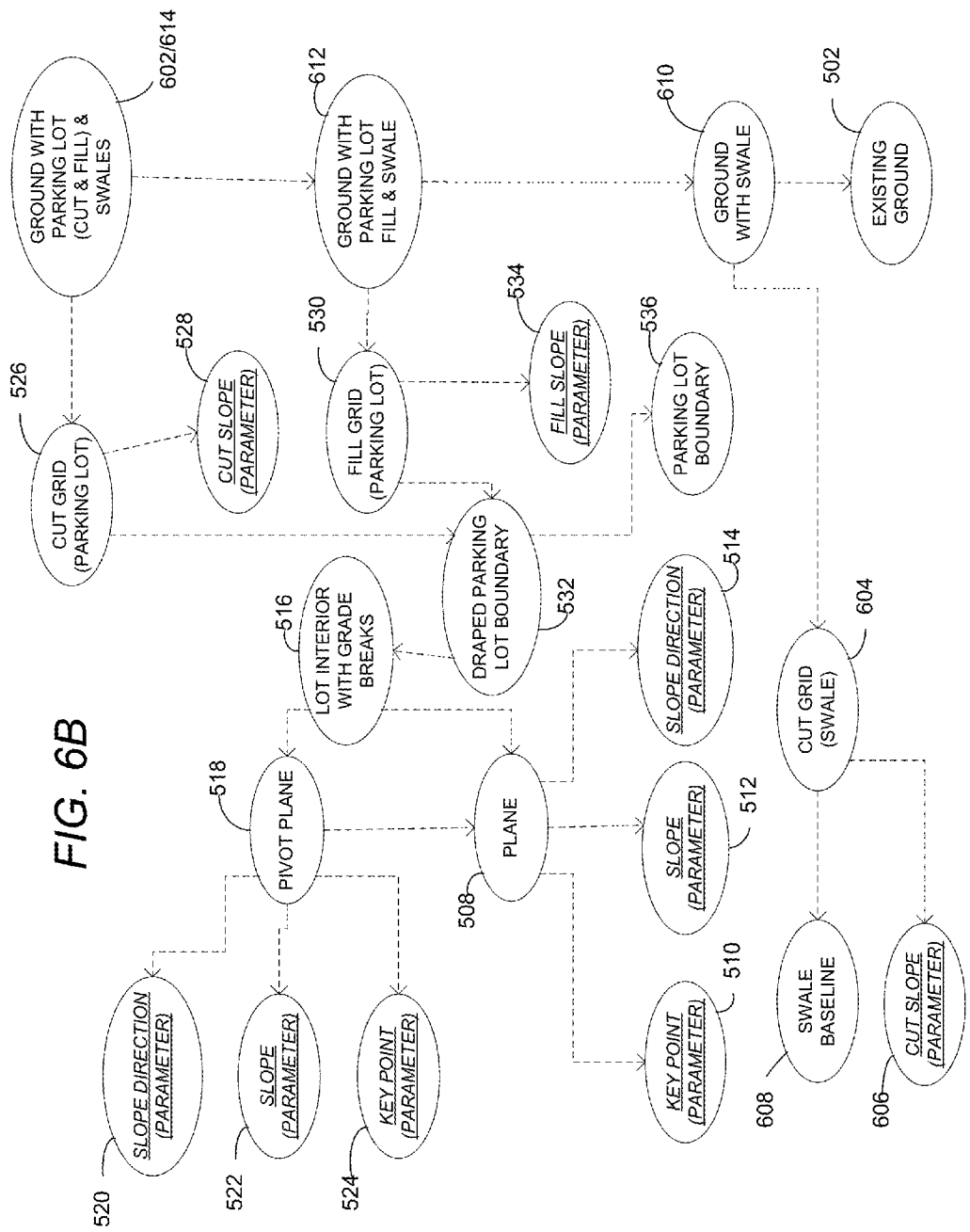

FIG. 6B illustrates the resulting model of a finished ground with swale 610, obtained by reordering the elements. Clicking (e.g., using ctrl+click) at a location on the existing ground 502 repeatedly on this model will show the updated sequential stages with which the ground was modified, namely, existing ground 502, ground with swale 610, ground with swale and parking lot fill 612, and finished ground with parking lot (cut and fill) and swale 602/614, in that order. If the user clicks the parking lot cut geometry 526 and edits the value of slope 528, this will only update two nodes: the geometry of cut area, and the finished ground with parking lot and swale 602/614. All other nodes would remain undisturbed. In this way, the elements of a model can be re-ordered to change the history of operations with which the ground 502 was modified.

Figure 7:
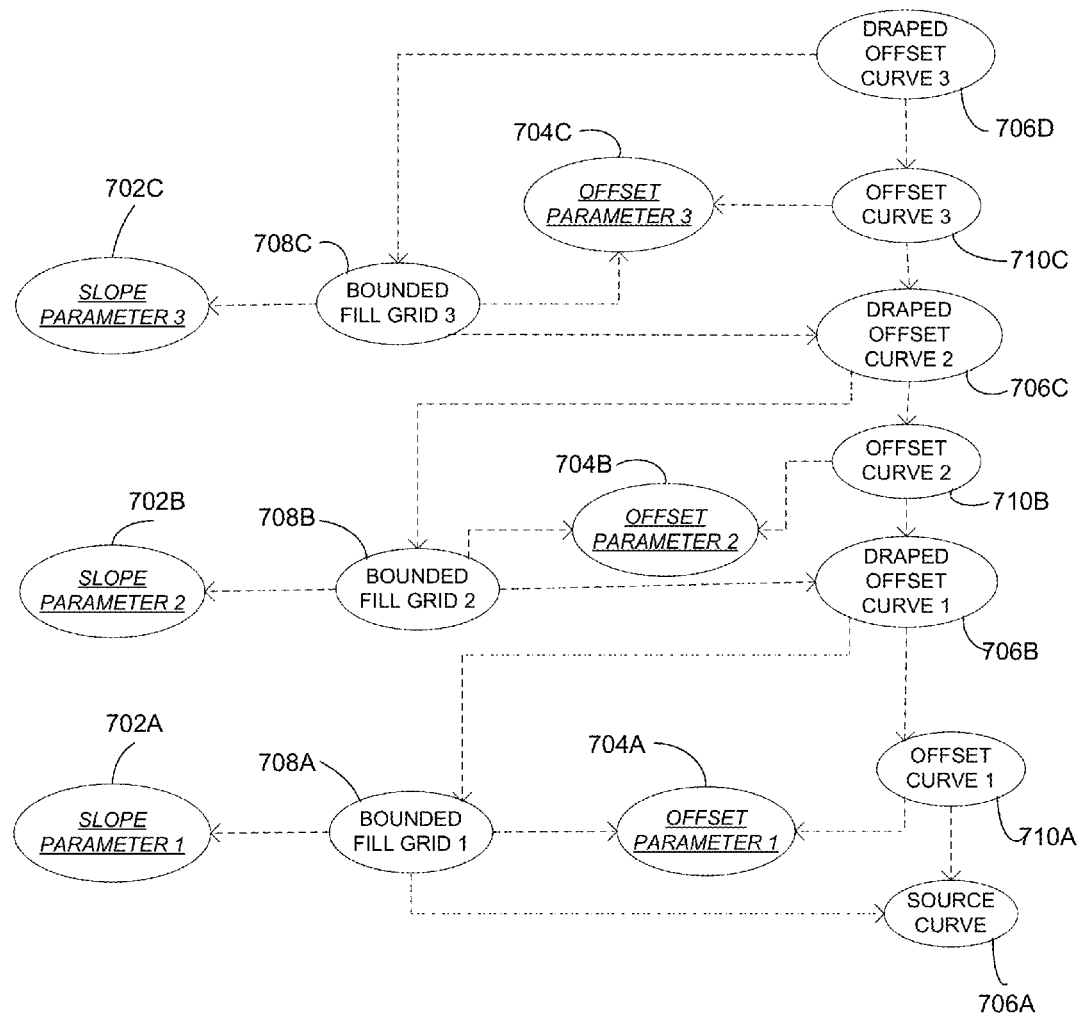
FIG. 7 shows an exemplary working geometry of a benched slope, created from draped offset sub-objects, in accordance with one or more embodiments of the invention.

FIG. 7 shows an exemplary working geometry of a benched slope. Each slope is created by specifying a slope 702A-702C and an offset value 704A-704C and is projected from a curve, which may be a database object, or a sub-object of the model. The first slope is usually projected from a database curve entity 706A. Subsequent slopes are projected from previously generated draped offset curves 706B, 706C, etc. The output of this operation is stored in a bounded graded element 708A-708C (whose width is determined by an offset value 704A-C), and an offset curve 710A-C draped on the graded element (resulting in draped offset curve 706B-D). The bounded graded element 708 and offset curve 710 share the same input parameter (offset) 704 and are sub-objects of the model. The subsequent slopes are projected from the previously draped offset sub-objects 706B-C. A benched slope, consisting of cascaded graded elements is created in this way.

When the user sub-selects an offset sub-object 710, the offset parameter 704 is displayed via a transient dynamic dimension object. The user can edit the value of offset 704, and all the dependent elements are updated in the correct sequence. Since the offset parameter 704 controls the geometry of the bounded grid 708 as well as the offset curve 710, both these elements are updated first and then the dependent elements are updated, in an order dictated by the order of dependencies. A benched slope can be edited and fine-tuned in this way.

CONCLUSION

This concludes the description of the preferred embodiment of the invention. The following describes some alternative embodiments for accomplishing the present invention.

For example, any type of computer, such as a mainframe, minicomputer, or personal computer, or computer configuration, such as a timesharing mainframe, local area network, or standalone personal computer, could be used with the present invention. In summary, embodiments of the invention allow users to optimize their designs with intuitive user interaction (in 2D and 3D) and dynamic feedback. For example, the user can change the pond bottom slope or water-level interactively to control the storage volume (e.g., users can change the slope of a pond bank interactively while trying to determine a maximum fill level of the pond—the resulting volume will automatically/dynamically update as the pond parameters are modified). Further, embodiments of the invention allow the users to track the history of operations interactively, and understand the steps with which the existing ground was re-formed into the finished ground. Being able to review designs in 3D helps users visualize the design, streamlining collaboration.

Further, embodiments of the invention allow users to build a stepped parking lot with attached bounded planes with specified flow grades and directions, to direct drainage away from a building footprint and into the outfall points. Embodiments of the invention allow users to add fine details like sidewalks, retaining walls, curbs and gutters, whose dimensions can be edited interactively. The user is presented with simple workflows to create enhanced land features and modify them using 3D model interaction.

In addition, an important aspect of a cost-effective design is to obtain a perfect earthwork balance. A grading plan may have to go through several iterations before it yields an acceptable earthwork balance. As the design progresses, the cut and fill values must be adjusted to minimize the earthwork. Embodiments of the invention allow the user to attain the earthwork balance by raising or lowering specific areas of cuts or fills interactively until the desired level of precision is obtained. Such interaction may be performed in-canvas while directly modifying a composite object and/or sub-object in a dynamically updated terrain model. This allows the user to observe the impact of edits on many design aspects simultaneously (like drainage pattern, aesthetics) to build a cost-effective, sustainable design that balances all project requirements.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer implemented method for manipulating a terrain in a drawing comprising:
   (a) obtaining, in a computer-aided design (CAD) building information modeling (BIM) application executing in a computer, a composite object of the terrain, wherein:
      (i) the composite object comprises a combination of two or more sub-objects;
      (ii) each of the two or more sub-objects defines a geometry that is part of the terrain;
      (iii) each of the two or more sub-objects is a result of an operation; and
      (iv) the two or more sub-objects are arranged in a system of dependent relationships;
   (b) drawing, in the computer, each of the two or more sub-objects on a separate drawable interface instance, wherein each of the two or more sub-objects corresponds to a different drawable interface instance;
   (c) selecting, in the computer, one of the two or more sub-objects;
   (d) in response to the selecting, separately displaying, on a display device communicatively coupled to the computer, the selected sub-object in the corresponding drawable interface instance
   (e) directly modifying, in-canvas via the computer, the selected sub-object using the corresponding drawable interface instance;
   (f) in response to the directly modifying, dynamically updating the terrain;
   (g) displaying, on the display device, the updated terrain;
   (h) selecting one of the two or more sub-objects corresponding to an existing ground and clicking repeatedly; and
   (i) in response to the selecting and clicking repeatedly, showing sequential stages with which the existing ground was modified incrementally with each operation applied to the existing ground to reform the existing ground into the updated terrain.

2. The computer-implemented method of claim 1, wherein:
   the selecting comprises receiving user clicking input via a cursor control device while a cursor is over one of the two or more sub-objects.

3. The computer-implemented method of claim 1, further comprising:
   switching to a different one of the two or more sub-objects by selecting the different one of the two or more sub-objects.

4. The computer-implemented method of claim 1, further comprising:
   in response to the selecting, creating and displaying one or more transient dynamic dimension objects representing one or more corresponding input parameters of the selected sub-object; and
   the directly modifying the selected sub-object by grip-editing one of the one or more transient dimension objects representing the corresponding input parameters of the selected sub-object.

5. The computer-implemented method of claim 1, wherein the directly modifying is performed by sending the selected sub-object to front or back.

6. The computer-implemented method of claim 1, wherein the directly modifying is performed by replacing the selected sub-object with a new composite sub-object created from the selected sub-object.

7. The computer-implemented method of claim 6, wherein the replacing the selected sub-object with the new composite sub-object created from the selected sub-object further comprises combining planes with specific flow grades and directions to build a surface layout, thus allowing control on directing drainage to outfall points.

8. The computer-implemented method of claim 1, wherein:
   every sub-object is drawn with a unique color and selection marker;
   each drawable interface instance draws colored contours in two-dimensional (2D) view;
   each drawable interface instance draws colored faces in three-dimensional (3D) view;
   the directly modifying modifies the selected sub-object in either the 2D view or the 3D view; and the dynamically updating comprises dynamically updating both the 2D view and the 3D view of the drawable instance containing the updated terrain.

9. The computer-implemented method of claim 1, wherein:
in response to the selecting, the separately displaying the selected sub-object in the corresponding drawable interface instance comprises displaying the selected sub-object as a whole to the sub-object's full extents.

10. The computer-implemented method of claim 1, wherein:
reselecting the sub-object again after step (d) displays a next composite sub-object created from the reselected sub-object in the drawable interface instance corresponding to the composite sub-object.

11. The computer-implemented method of claim 10, wherein displaying the next composite sub-object in the drawable interface instance corresponding to the composite sub-object comprises displaying the composite sub-object as a whole to the sub-object's full extents.

12. The computer-implemented method of claim 10, wherein the reselecting of the sub-object displays the updated terrain if no composite object was created from the selected sub-object.

13. The computer-implemented method of claim 1, further comprising traversing the sequential stages and querying cut and fill volumes at any intermediate state.

14. The computer-implemented method of claim 1, wherein:
the displaying of the updated terrain comprises displaying only a part of the two or more sub-objects that contribute to the composite object representing a finished terrain.

15. An apparatus for manipulating a terrain in a drawing in a computer system comprising:
(a) a computer having a memory; and
(b) a computer-aided design (CAD) building information modeling (BIM) application executing on the computer, wherein the CAD BIM application is configured to:
  (i) obtain, in the CAD BIM application, a composite object of the terrain, wherein
    (1) the composite object comprises a combination of two or more sub-objects;
    (2) each of the two or more sub-objects defines a geometry that is part of the terrain;
    (3) each of the two or more sub-objects is a result of an operation; and
    (4) each of the two or more sub-objects is arranged in a system of dependent relationships;
  (ii) draw each of the two or more sub-objects on a separate drawable interface instance, wherein each of the two or more sub-objects corresponds to a different drawable interface instance;
  (iii) select one of the two or more sub-objects;
  (iv) in response to the selecting, separately display the selected sub-object in the corresponding drawable interface instance;
  (v) directly modify, in-canvas, the selected sub-object using the corresponding drawable interface instance;
  (vi) in response to the directly modifying, dynamically update the terrain;
  (vii) display the updated terrain;
  (viii) select the sub-object corresponding to an existing ground and click repeatedly; and
  (ix) in response to the select and click repeatedly, show sequential stages with which the existing ground was modified incrementally with each operation applied to the existing ground to reform the existing ground into the updated terrain.

16. The apparatus of claim 15, wherein:
the application is configured to select by receiving user clicking input via a cursor control device while a cursor is over one of the two or more sub-objects.

17. The apparatus of claim 15, wherein the application is further configured to:
switch to a different one of the two or more sub-objects by selecting the different one of the two or more sub-objects.

18. The apparatus of claim 15, wherein the application is further configured to:
in response to the selecting, create and display one or more transient dynamic dimension objects representing one or more corresponding input parameters of the selected sub-object; and
directly modify the selected sub-object by grip-editing one of the one or more transient dimension objects representing the corresponding input parameters of the selected sub-object.

19. The apparatus of claim 15, wherein the application is further configured to directly modify by sending the selected sub-object to front or back.

20. The apparatus of claim 15, wherein the application is further configured to directly modify by replacing the selected sub-object with a new composite sub-object created from the selected sub-object.

21. The apparatus of claim 20, wherein the application is configured to the replace the selected sub-object with the new composite sub-object created from the selected sub-object by combining planes with specific flow grades and directions to build a surface layout, thus allowing control on directing drainage to outfall points.

22. The apparatus of claim 15, wherein:
every sub-object is drawn with a unique color and selection marker;
each drawable interface instance draws colored contours in a two-dimensional (2D) view;
each drawable interface instance draws colored faces in a three-dimensional (3D) view;
the application is configured to directly modify by modifying the selected sub-object in either the 2D view or the 3D view; and
the application is configured to dynamically update by dynamically updating both the 2D view and the 3D view of the drawable instance containing the updated terrain.

23. The apparatus of claim 15, wherein:
in response to the selecting, the separately displaying of the selected sub-object in the corresponding drawable interface instance comprises displaying the selected sub-object as a whole to the sub-object's full extents.

24. The apparatus of claim 15, wherein:
reselecting the sub-object again after step (iv) displays a next composite sub-object created from the reselected sub-object in the drawable interface instance corresponding to the composite sub-object.

25. The apparatus of claim 24, wherein the application is configured to display the next composite sub-object in the drawable interface instance corresponding to the composite sub-object by displaying the composite sub-object as a whole to the sub-object's full extents.

26. The apparatus of claim 24, wherein:
in response to the reselecting, the application is configured to display the updated terrain if no composite object was created from the selected sub-object.

27. The apparatus of claim 15, wherein the application is further configured to traverse the sequential stages and query cut and fill volumes at any intermediate state.

28. The apparatus of claim 15, wherein:
the application is configured to display the updated terrain by displaying only parts of the two or more sub-objects that contribute to the composite object representing the updated terrain.

\* \* \* \* \*